United States Patent
Sakurai et al.

(10) Patent No.: US 10,564,546 B2
(45) Date of Patent: Feb. 18, 2020

(54) RESIST PATTERN-FORMING METHOD

(71) Applicant: JSR CORPORATION, Tokyo (JP)

(72) Inventors: Tomohiko Sakurai, Tokyo (JP);
Sousuke Oosawa, Tokyo (JP);
Hiromitsu Nakashima, Tokyo (JP);
Kousuke Terayama, Tokyo (JP)

(73) Assignee: JSR CORPORATION, Tokyo (JP)

( * ) Notice: Subject to any disclaimer, the term of this patent is extended or adjusted under 35 U.S.C. 154(b) by 86 days.

(21) Appl. No.: 15/592,373

(22) Filed: May 11, 2017

(65) Prior Publication Data

US 2017/0329228 A1 Nov. 16, 2017

(30) Foreign Application Priority Data

May 12, 2016 (JP) ................. 2016-096529
May 10, 2017 (JP) ................. 2017-094229

(51) Int. Cl.
*G03F 7/11* (2006.01)
*G03F 7/20* (2006.01)

(52) U.S. Cl.
CPC .............. *G03F 7/11* (2013.01); *G03F 7/2041* (2013.01)

(58) Field of Classification Search
CPC .................. G03F 7/2041; G03F 7/11

USPC ...................................... 430/273.1
See application file for complete search history.

(56) References Cited

U.S. PATENT DOCUMENTS 7,470,503 B1 * 12/2008 Brandl ....................... G03F 7/11
430/311
2006/0141400 A1 6/2006 Hirayama et al.

FOREIGN PATENT DOCUMENTS

| JP | H06-012452 B2 | 2/1994 |
| JP | 2007-324385 A | 12/2007 |
| JP | 2008-042019 A | 2/2008 |
| WO | WO 2004/074937 A1 | 9/2004 |

* cited by examiner

*Primary Examiner* — Daborah Chacko-Davis
(74) *Attorney, Agent, or Firm* — Oblon, McClelland, Maier & Neustadt, L.L.P.

(57) ABSTRACT

A resist pattern-forming method includes applying a photoresist composition directly or indirectly on a front face of a substrate to form a photoresist film. A topcoat layer is laminated directly or indirectly on a front face of the photoresist film. The photoresist film is subjected to liquid immersion lithography in a presence of a liquid immersion liquid on a front face of the topcoat layer. Part of the topcoat layer is removed after subjecting the photoresist film to the liquid immersion lithography. The photoresist film is developed after the part of the topcoat layer is removed.

22 Claims, No Drawings

RESIST PATTERN-FORMING METHOD

CROSS-REFERENCE TO RELATED APPLICATIONS

The present application claims priority to Japanese Patent Application No. 2016-096529, filed May 12, 2016, and to Japanese Patent Application No. 2017-094229, filed May 10, 2017. The contents of these applications are incorporated herein by reference in their entirety.

BACKGROUND OF THE INVENTION

Field of the Invention

The present invention relates to a resist pattern-forming method.

Discussion of the Background

With the progress of miniaturization of various types of electronic device structures such as semiconductor devices and liquid crystal devices, microfabrication of a resist pattern in lithography processes has been demanded. To address the demands described above, a liquid immersion lithography process has been used in which exposure is performed in a state of a space between a lens and a photoresist film being filled with an immersion medium such as pure water or a fluorine inert fluid. Such a liquid immersion lithography process enables the numerical aperture (NA) of the lens to be increased, leading to an advantage that a high resolution can be obtained.

In pattern-forming methods that involve this liquid immersion lithography process, inhibiting the elution of a photoresist film component into a liquid immersion liquid, occurrence of pattern defects resulting from droplets of a liquid immersion liquid remaining on a front face of the photoresist film, and the like has been demanded. As a technique for meeting these demands, a topcoat layer is provided between the photoresist film and the liquid immersion liquid (see PCT International Publication No. 2004/74937, and Japanese Unexamined Patent Application, Publication Nos. 2007-324385 and 2008-42019).

SUMMARY OF THE INVENTION

According to an aspect of the present invention, a resist pattern-forming method includes applying a photoresist composition directly or indirectly on a front face of a substrate to form a photoresist film. A topcoat layer is laminated directly or indirectly on a front face of the photoresist film. The photoresist film is subjected to liquid immersion lithography in a presence of a liquid immersion liquid on a front face of the topcoat layer. Part of the topcoat layer is removed after subjecting the photoresist film to the liquid immersion lithography. The photoresist film is developed after the part of the topcoat layer is removed.

DESCRIPTION OF THE EMBODIMENTS

According to an embodiment of the invention, a resist pattern-forming method includes the steps of: applying a photoresist composition directly or indirectly on a front face of a substrate (hereinafter, may be also referred to as "applying step"); laminating a topcoat layer directly or indirectly on a front face of a photoresist film obtained by the applying (hereinafter, may be also referred to as "laminating step"); subjecting the photoresist film to liquid immersion lithography in the presence of a liquid immersion liquid on a front face of the topcoat layer; and developing the photoresist film (hereinafter, may be also referred to as "liquid immersion lithography step"), the method further including removing a part of the topcoat layer between the subjecting to liquid immersion lithography and the developing (hereinafter, may be also referred to as "removing step").

According to the resist pattern-forming method of the embodiment of the present invention, a resist pattern with less watermark defects and residue defects can be formed. Therefore, the resist pattern-forming method can be preferably used for the processing processes of semiconductor devices for which the further progress of miniaturization in the future is expected.

Hereinafter, embodiments of the present invention will be described in detail. It is to be noted that the present invention is not limited to the following embodiments.

Resist Pattern-Forming Method

The resist pattern-forming method according to an embodiment of the present invention includes the applying step, the laminating step, the liquid immersion lithography step and the development step, and further includes the removing step between the liquid immersion lithography step and the development step.

The resist pattern-forming method of the embodiment of the present invention enables a resist pattern with less watermark defects and residue defects to be formed. Although not necessarily clarified, and without wishing to be bound by any theory, the reason for achieving the effects described above due to comprising the aforementioned features is inferred as in the following, for example. Specifically, by virtue of comprising the step of laminating a topcoat layer on a front face of a photoresist film, the resist pattern-forming method enables the generation of the watermark defects to be inhibited in in the liquid immersion lithography step. In addition, because of comprising the step of removing a part of the topcoat layer, after the liquid immersion lithography step and before the development step, so as to remove beforehand a polymer that remains undissolved in a developer solution among polymers that form the topcoat layer, inhibition of the generation of residue defects would be enabled. Moreover, the polymer, etc. in the topcoat layer not having been removed in the removing step would be responsible for the inhibition of the generation of the residue defects, i.e., in the development step, the solubility in the developer solution of the polymer, etc. being poorly soluble in the photoresist film which may cause the residue defects would be improved. Each of the steps will be described below.

Applying Step

In this step, a photoresist composition is applied directly or indirectly on the front face of the substrate. Accordingly, the photoresist film is formed on the front face of the substrate directly or via other layer. The substrate for use is typically exemplified by silicon wafers, silicon wafers coated with aluminum, and the like. In addition, in order to maximally utilize the characteristics of the formed photoresist film, an organic or inorganic antireflective film is preferably formed beforehand as the other layer, on the front face of the substrate, as disclosed in, for example, Japanese Examined Patent Application, Publication No. H6-12452, etc.

Photoresist Composition

In regard to the photoresist composition, the type thereof is not particularly limited, and may be appropriately selected from among photoresist compositions conventionally used for forming a photoresist film, in accordance with an intended use of the resist. Of these, a photoresist composition that contains a polymer (hereinafter, may be also referred to as "polymer (P)") that includes an acid-labile group (hereinafter, may be also referred to as "acid-labile group (a)"), and a radiation-sensitive acid generator (hereinafter, may be also referred to as "acid generator (Q)") is preferred.

In the polymer (P), a structural unit that includes the acid-labile group (a) (hereinafter, may be also referred to as "structural unit (p)") is exemplified by a structural unit represented by the following formula (A), and the like.

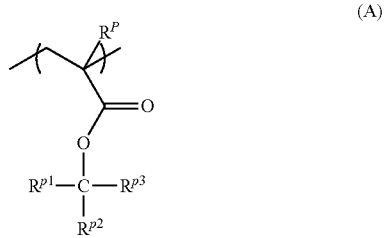

(A)

In the above formula (A), $R^P$ represents a hydrogen atom, a fluorine atom, a methyl group or a trifluoromethyl group; $R^{p1}$ represents a monovalent hydrocarbon group having 1 to 20 carbon atoms; and $R^{p2}$ and $R^{p3}$ each independently represent a monovalent hydrocarbon group having 1 to 20 carbon atoms, or $R^{p2}$ and $R^{p3}$ taken together represent an alicyclic structure having 3 to 20 ring atoms together with the carbon atom to which $R^{p2}$ and $R^{p3}$ bond.

In light of the copolymerizability of a monomer that gives the structural unit (p), $R^P$ represents preferably a hydrogen atom or a methyl group, and more preferably a methyl group.

The monovalent hydrocarbon group having 1 to 20 carbon atoms which may be represented by $R^{p1}$, $R^{p2}$ or $R^{p3}$ is exemplified by a monovalent chain hydrocarbon group having 1 to 20 carbon atoms, a monovalent alicyclic hydrocarbon group having 3 to 20 carbon atoms, a monovalent aromatic hydrocarbon group having 6 to 20 carbon atoms, and the like.

Examples of the monovalent chain hydrocarbon group having 1 to 20 carbon atoms include alkyl groups such as a methyl group, an ethyl group, an n-propyl group, an i-butyl group and an n-butyl group.

Examples of the monovalent alicyclic hydrocarbon group having 3 to 20 carbon atoms include monocyclic alicyclic hydrocarbon groups such as a cyclobutyl group, a cyclopentyl group, a cyclohexyl group and a cyclohexenyl group; polycyclic alicyclic hydrocarbon groups such as a norbornyl group, an adamantyl group and a norbornenyl group; and the like.

Examples of the monovalent aromatic hydrocarbon group having 6 to 20 carbon atoms include aryl groups such as a phenyl group, a tolyl group, a xylyl group and a naphthyl group; aralkyl groups such as a benzyl group, a phenethyl group and a naphthylmethyl group; and the like.

Examples of the alicyclic structure having 3 to 20 carbon atoms which may be taken together represented by $R^{p2}$ and $R^{p3}$ together with the carbon atom to which $R^{p2}$ and $R^{p3}$ bond include: monocyclic alicyclic structures such as a cyclopentane structure, a cyclohexane structure and a cyclohexene structure; polycyclic alicyclic structures such as a norbornane structure, an adamantane structure and a norbornene structure; and the like.

The structural unit (p) is exemplified by a structural unit derived from: (meth)acrylate that includes a 1-alkyl-1-monocyclic alicyclic hydrocarbon group such as 1-ethyl-1-cyclopentyl (meth)acrylate; (meth)acrylate that includes a 2-alkyl-2-polycyclic alicyclic hydrocarbon group such as 2-i-propyl-2-adamantyl (meth)acrylate; and the like.

The polymer (P) preferably further has, in addition to the structural unit (p), a structural unit (hereinafter, may be also referred to as "structural unit (q)") having a lactone structure, a cyclic carbonate structure, a sultone structure or a combination thereof.

The structural unit (q) is exemplified by a structural unit derived from a (meth)acrylic acid ester having:
a norbornanelactone structure, a butyrolactone structure or the like, as the lactone structure;
an ethylene carbonate structure, a propylene carbonate structure or the like, as the cyclic carbonate structure;
a norbornanesultone structure, a propane sultone structure or the like, as the sultone structure; and the like.

Furthermore, the polymer (P) may have other structural unit than the structural unit (p) and the structural unit (q). The other structural unit is exemplified by: a structural unit that includes a hydrocarbon group having 4 or more and 20 or less carbon atoms (hereinafter, may be also referred to as "structural unit (r)"); a structural unit that includes a polar group such as a hydroxyl group; and the like. Exemplary structural unit (r) includes a structural unit derived from tricyclodecanyl (meth)acrylate, and the like.

The lower limit of the proportion of the structural unit (p) with respect to the total structural units constituting the polymer (P) is preferably 25 mol %, and more preferably 35 mol %. The upper limit of the proportion of the structural unit (p) is preferably 60 mol %, and more preferably 50 mol %. When the proportion of the structural unit (p) falls within the above range, the resolution of the photoresist composition can be improved.

The lower limit of the proportion of the structural unit (q) with respect to the total structural units constituting the polymer (P) is preferably 20 mol %, and more preferably 30 mol %. The upper limit of the proportion of the structural unit (q) is preferably 70 mol %, and more preferably 60 mol %. When the proportion of the structural unit (q) falls within the above range, the solubility of the photoresist film formed from the photoresist composition, in the developer solution can be adjusted properly, and furthermore, the adhesiveness between the photoresist film and the substrate can be improved.

The upper limit of the proportion of the other structural unit with respect to the total structural units constituting the polymer (P) is preferably 20 mol %, and more preferably 15 mol %.

The acid generator (Q) is a substance that generates an acid (hereinafter, may be also referred to as "acid (b)") upon an irradiation with a radioactive ray (exposure). An action of the acid (b) thus generated allows the acid-labile group (a) having protected an acidic group such as the carboxy group of the polymer (P) to be dissociated, thereby generating the acidic group, in light-exposed regions. As a result, the solubility of the polymer (P) in the developer solution is altered in the light-exposed regions, and thus a resist pattern is formed.

The acid generator (Q) may be contained in the photoresist composition: in the form of a compound as described later (hereinafter, may be also referred to as "acid generating agent (Q)"); in the form of an acid generator incorporated as a part of the polymer; or in both of these forms.

The acid (b) generated upon the exposure is exemplified by a sulfonic acid, a carboxylic acid, a disulfonylimide acid, and the like.

Exemplary sulfonic acid generated upon the exposure includes:

(1) a compound in which at least one fluorine atom or fluorinated hydrocarbon group bonds to a carbon atom adjacent to a sulfo group;

(2) a compound in which any fluorine atom or any fluorinated hydrocarbon group does not bond to a carbon atom adjacent to a sulfo group; and the like.

Exemplary carboxylic acid generated upon the exposure includes:

(3) a compound in which at least one fluorine atom or fluorinated hydrocarbon group bonds to a carbon atom adjacent to a carboxy group;

(4) a compound in which any fluorine atom or any fluorinated hydrocarbon group does not bond to a carbon atom adjacent to a carboxy group; and the like.

Exemplary disulfonylimide acid generated upon the exposure includes:

(5) a compound in which at least one fluorine atom or fluorinated hydrocarbon group bonds to a carbon atom adjacent to a sulphonyl group;

(6) a compound in which any fluorine atom or any fluorinated hydrocarbon group does not bond to a carbon atom adjacent to a sulphonyl group; and the like.

The acid (b) is preferably the compound of (1) or (5) above, and more preferably the compound of (1) above. Furthermore, the acid (b) is particularly preferably a compound having a cyclic structure.

The acid generating agent (Q) is exemplified by an onium salt compound, an N-sulfonyloxyimide compound, a halogen-containing compound, and a diazoketone compound that generate the acid (b) upon the exposure. Exemplary onium salt compound includes a sulfonium salt, a tetrahydrothiophenium salt, an iodonium salt, a phosphonium salt, a diazonium salt, a pyridinium salt, and the like. Of these, the sulfonium salt and the tetrahydrothiophenium salt are preferred.

Examples of the sulfonium salt include triphenylsulfonium nonafluoro-n-butanesulfonate, 4-cyclohexylphenyldiphenylsulfonium nonafluoro-n-butanesulfonate, triphenylsulfonium 2-(bicyclo[2.2.1]heptan-2'-yl)-1,1,2,2-tetrafluoroethanesulfonate, triphenylsulfonium 2-(bicyclo[2.2.1]heptan-2'-yl)-1,1-difluoroethanesulfonate, and the like.

Examples of the tetrahydrothiophenium salt include 1-(4-n-butoxynaphthalen-1-yl)tetrahydrothiophenium nonafluoro-n-butanesulfonate, 1-(4-n-butoxynaphthyl)tetrahydrothiophenium 2-(bicyclo[2.2.1]heptan-2'-yl)-1,1,2,2-tetrafluoroethanesulfonate, and the like.

The photoresist composition may contain, in addition to the polymer (P) and the acid generating agent (Q), other component such as an acid diffusion control agent (R), a water-repellent resin (F), a surfactant, and the like. The acid diffusion control agent (R) is exemplified by: an amine compound such as trioctylamine and triethanolamine; an N-t-alkoxycarbonyl-containing amide compound such as R-(+)-(t-butoxycarbonyl)-2-piperidinemethanol and N-t-butoxycarbonyl-4-hydroxypiperidine; a compound (G) that generates upon an exposure, an acid that does not substantially allow the acid-labile group (a) to be dissociated; and the like. Examples of the compound (G) include triphenylsulfonium salicylate, and the like. The water-repellent resin (F) is exemplified by a fluorine-containing resin, and more specifically, a resin that includes a fluorinated hydrocarbon group, a chain perfluoroalkyl polyether, a cyclic perfluoroalkyl polyether, a polychlorotrifluoroethylene, a polytetrafluoroethylene, a tetrafluoroethylene-perfluoroalkoxyethylene copolymer, a tetrafluoroethylene-hexafluoropropylene copolymer, and the like.

The photoresist composition is prepared by dissolving the polymer (P), the acid generating agent (Q), and as needed, the acid diffusion control agent (R), etc. in a solvent, for example. In addition, the photoresist composition filtered through a filter having a pore size of about 30 nm is typically used. In light of ease of applying, the lower limit of the solid content concentration of the photoresist composition is preferably 0.2% by mass, and more preferably 1% by mass. The upper limit of the solid content concentration is preferably 20% by mass, and more preferably 10% by mass.

The applying procedure of the photoresist composition is exemplified by conventionally known coating procedures such as spin coating, cast coating, and roll coating. Prebaking (PB) may be performed after applying the photoresist composition onto the substrate in order to evaporate the solvent. The lower limit of the temperature of the PB is preferably 50° C., and more preferably 70° C. The upper limit of the temperature of the PB is preferably 150° C., and more preferably 120° C. The lower limit of the time period of the PB is preferably 10 sec, and more preferably 30 sec. The upper limit of the time period of the PB is preferably 600 sec, and more preferably 300 sec.

Laminating Step

In this step, the topcoat layer is laminated directly, or indirectly, i.e., via other layer, on the front face of the photoresist film obtained in the applying step. This topcoat layer is typically laminated by applying a topcoat composition directly or indirectly, preferably directly, on the front face of the photoresist film.

Topcoat Composition

The topcoat composition typically contains a polymer (hereinafter, may be also referred to as "polymer (A)") and a solvent (hereinafter, may be also referred to as "solvent (B)"). The topcoat composition may contain other component such as a surfactant, etc., in addition to the polymer (A) and the solvent (B).

Any polymer may be used as the polymer (A) so long as it can form a topcoat layer and can be used for liquid immersion lithography. In addition, the polymer (A) preferably comprises two or more types of polymers having different characteristics. Examples of the characteristics of these polymers include a rate of dissolution with respect to a removing liquid, an etching rate of dry etching, a receding contact angle in a state of a film being formed therefrom, and the like.

The polymer (A) is exemplified by a water-repellent resin, an acidic resin, and the like. The water-repellent resin as referred to herein means a resin having the receding contact angle of no less than 80° with respect to water in the state of a film being formed. The "acidic resin" as referred to herein means a resin having an acidic functional group having pKa of no greater than 10. The polymer (A) may contain other resin than the water-repellent resin and the acidic resin.

The water-repellent resin is exemplified by a fluorine-containing resin, and more specifically, a resin containing a fluorinated hydrocarbon group, a chain perfluoroalkyl polyether, a cyclic perfluoroalkyl polyether, a polychlorotrifluoroethylene, a polytetrafluoroethylene, a tetrafluoroethylene-perfluoroalkoxyethylene copolymer, a tetrafluoroethylene-hexafluoropropylene copolymer, and the like.

The lower limit of the mass percentage content of fluorine atom in the fluorine-containing resin is preferably 0.1% by mass, more preferably 1% by mass, and still more preferably 5% by mass. The upper limit of the mass percentage content is preferably 30% by mass, and more preferably 25% by mass.

The acidic resin is exemplified by a resin having an oxoacid group, a resin having a phenolic hydroxyl group, and the like. The oxoacid group is exemplified by a sulfo group, a carboxy group, and the like.

When the topcoat composition contains two or more types of polymers having different characteristics as the polymer (A), the two or more types of polymers preferably comprise the water-repellent resin and the acidic resin.

The solvent (B) is exemplified by an alcohol solvent, an ether solvent, a ketone solvent, an amide solvent, an ester solvent, a hydrocarbon solvent, and the like.

Examples of the alcohol solvent include:

monohydric alcohol solvents such as methanol, ethanol, n-propanol, iso-propanol, n-butanol, iso-butanol, sec-butanol, tert-butanol, n-pentanol, iso-pentanol, 2-methylbutanol, sec-pentanol, tert-pentanol, 3-methoxybutanol, n-hexanol, 2-methylpentanol, 4-methyl-2-pentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, cyclohexanol, methylcyclohexanol, 3,3,5-trimethyl cyclohexanol, benzyl alcohol and diacetone alcohol;

polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol and tripropylene glycol;

partially etherified polyhydric alcohol solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether and dipropylene glycol monopropyl ether; and the like.

Examples of the ether solvent include:

dialkyl ether solvents such as diethyl ether, dipropyl ether, dibutyl ether and diisoamyl ether;

aromatic ring-containing ether solvents such as anisole and diphenyl ether;

cyclic ether solvents such as tetrahydrofuran and dioxane; and the like.

Examples of the ketone solvent include:

chain ketone solvents such as acetone, 2-butanone, methyl-n-propyl ketone, methyl-n-butyl ketone, diethyl ketone, methyl-iso-butyl ketone, methyl-n-amyl ketone, ethyl-n-butyl ketone, methyl-n-hexyl ketone, di-iso-butyl ketone, trimethyl nonanone, 2,4-pentanedione, acetonyl acetone and acetophenone;

cyclic ketone solvents such as cyclopentanone, cyclohexanone, cycloheptanone, cyclooctanone and methylcyclohexanone; and the like.

Examples of the amide solvent include:

chain amide solvents such as N-methylformamide, N,N-dimethylformamide, N,N-diethylformamide, acetamide, N-methylacetamide, N,N-dimethylacetamide and N-methylpropionamide;

cyclic amide solvents such as N,N'-dimethylimidazolidinone and N-methylpyrrolidone; and the like.

Examples of the ester solvent include:

monocarboxylic acid ester solvents such as methyl acetate, ethyl acetate, γ-butyrolactone, γ-valerolactone, n-propyl acetate, iso-propyl acetate, n-butyl acetate, iso-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethyl propionate, n-butyl propionate, iso-amyl propionate, methyl lactate, ethyl lactate, n-butyl lactate and n-amyl lactate;

polyhydric alcohol partially etherified carboxylate solvents such as ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate and dipropylene glycol monoethyl ether acetate;

carbonate solvents such as dimethyl carbonate, diethyl carbonate, ethylene carbonate and propylene carbonate;

lactone solvents such as γ-butyrolactone and δ-valerolactone;

dicarboxylic acid ester solvents such as diethyl oxalate, di-n-butyl oxalate, diethyl malonate, dimethyl phthalate and diethyl phthalate;

glycol diacetate; methoxytriglycol acetate; and the like.

Examples of the hydrocarbon solvent include:

aliphatic hydrocarbon solvents such as n-pentane, iso-pentane, n-hexane, iso-hexane, n-heptane, iso-heptane, 2,2,4-trimethylpentane, n-octane, iso-octane, cyclohexane and methylcyclohexane;

aromatic hydrocarbon solvents such as benzene, toluene, xylene, mesitylene, ethylbenzene, trimethylbenzene, methylethylbenzene, n-propylbenzene, iso-propylbenzene, diethylbenzene, iso-butylbenzene, triethylbenzene, di-iso-propylbenzene, and n-amylnaphthalene; and the like.

The solvent (B) is preferably the ether solvent, the alcohol solvent and the fluorine solvent, more preferably the diallyl ether solvent, the monoalcohol solvent, and the fluorine-containing amine, and still more preferably diisoamyl ether, 4-methyl-2-pentanol and perfluorotributylamine.

The topcoat composition is prepared by dissolving the polymer (A) and other component as needed in the solvent (B), for example. In addition, the topcoat composition filtered through a filter having a pore size of about 30 nm is typically used. In light of ease of applying, the lower limit of the solid content concentration of the topcoat composition is preferably 0.2% by mass, and more preferably 1% by mass. The upper limit of the solid content concentration is preferably 20% by mass, and more preferably 10% by mass.

The applying procedure of the topcoat composition is exemplified by a similar procedure to the applying procedure of the photoresist composition in the aforementioned applying step. Prebaking (PB) is preferably performed after applying the topcoat composition. The lower limit of the temperature of the PB is preferably 50° C., and more preferably 70° C. The upper limit of the temperature of the PB is preferably 150° C., and more preferably 120° C. The lower limit of the time period of the PB is preferably 10 sec, and more preferably 30 sec. The upper limit of the time period of the PB is preferably 600 sec, and more preferably 300 sec.

Topcoat Layer

The topcoat layer constituted from the polymer (A) and the like is formed by removing the solvent (B) from the applied topcoat composition.

The lower limit of the average thickness of the topcoat layer thus formed is preferably 5 nm, more preferably 10 nm, and still more preferably 15 nm. The upper limit of the average thickness is preferably 100 nm, more preferably 70 nm, and still more preferably 50 nm.

It is preferred that the average thickness of the topcoat layer film thus formed is as approximate to an odd multiple of $\lambda/4$ m as possible wherein $\lambda$ represents the wavelength of the radioactive ray, and m represents the refractive index of the protection film. Accordingly, an effect of inhibiting reflection at the upper boundary of the photoresist film can be enhanced.

The topcoat layer preferably contains two or more types of polymers having different characteristics, and the two or more types of polymers preferably comprise the water-repellent resin and the acidic resin. In this case, it is preferred that the polymer removed in the removing step is the water-repellent resin.

Liquid Immersion Lithography Step

In the liquid immersion lithography step, the photoresist film is subjected to liquid immersion lithography with the liquid immersion liquid being placed on the front face of the topcoat layer. This liquid immersion lithography is performed typically by placing the liquid immersion liquid between the front face of the topcoat layer and an objective lens of a lithography device, and exposing the photoresist film through the liquid immersion liquid.

A liquid having a greater refractive index than that of air is typically used as the liquid immersion liquid. Water is preferably used as the liquid immersion liquid, and pure water is more preferably used. It is to be noted that pH of the liquid immersion liquid may be adjusted as needed. Irradiation with exposure light from the lithography device in the presence of this liquid immersion liquid, i.e., in a state in which a space between the lens of the lithography device and the photoresist film is filled with the liquid immersion liquid, allows the photoresist film to be exposed through a mask having a predetermined pattern.

The exposure light used for the liquid immersion lithography may be appropriately selected in accordance with the type of the photoresist film and/or the topcoat layer, and examples thereof include: visible light rays, ultraviolet rays such as g-rays and i-rays; far ultraviolet rays such as excimer laser beams; X-rays such as synchrotron radioactive rays; charged particle rays/beams such as electron beams. Of these, the far ultraviolet rays are preferred, an ArF excimer laser beam (wavelength: 193 nm) and a KrF excimer laser beam (wavelength: 248 nm) are more preferred, and the ArF excimer laser beam is still more preferred. In addition, the conditions for the irradiation of the exposure light, e.g., an exposure dose, etc., may be selected as appropriate in accordance with the blend formulation of the photoresist composition and/or the topcoat composition, the type of additives contained therein, and the like.

After subjecting to the liquid immersion lithography, post exposure baking (PEB) is preferably performed in order to improve the resolution, pattern configuration, developability etc. of the resulting resist pattern. The temperature of the PEB may be selected as appropriate in accordance with the type of the photoresist composition and the topcoat composition used, etc. The lower limit of the temperature of the PEB is preferably 50° C., and more preferably 80° C. The upper limit of the temperature of the PEB is preferably 200° C., and more preferably 150° C. The lower limit of the time period of the PEB is preferably 5 sec, and more preferably 10 sec. The upper limit of the time period of the PEB is preferably 600 sec, and more preferably 300 sec.

Removing Step

In the removing step, a part of the topcoat layer is removed. The part of the topcoat layer thus removed normally corresponds to a front face layer of the topcoat layer.

When the topcoat layer contains two or more types of polymers having different characteristics, in the removing step, it is preferred that at least a polymer that is localized on the front face side is removed. In addition, when the topcoat layer contains the water-repellant resin and the acidic resin as the two or more types of polymers, it is preferred that the polymer removed in the removing step is at least a part of the water-repellent resin.

The procedure for removing a part of the topcoat layer is not particularly limited, and examples thereof include: a procedure of removing by dissolving the surface layer of the topcoat layer with a removing liquid; a procedure of removing the surface layer of the topcoat layer by dry etching; and the like. Of these, the removing procedure with a removing liquid is preferred, since the part to be removed can be more readily adjusted in a simpler manner.

Removing Liquid

The removing liquid typically contains an organic solvent as a principal component. The lower limit of the percentage content of the organic solvent in the removing liquid is preferably 50% by mass, more preferably 80% by mass, and still more preferably 95% by mass. The upper limit of the percentage content is preferably 100% by mass, for example.

The organic solvent which may be contained in the removing liquid is exemplified by a similar organic solvent to the organic solvent contained in the aforementioned topcoat composition. Of these, the removing liquid principally containing an ether solvent, a hydrocarbon solvent, an alcohol solvent and/or a fluorine solvent is preferred.

The ether solvent is preferably diisoamyl ether and dibutyl ether.

The hydrocarbon solvent is preferably decane and cyclohexane.

The alcohol solvent is preferably 1-decanol and 4-methyl-2-pentanol.

The fluorine solvent is preferably perfluoro(2-butyltetrahydrofuran).

The removing liquid may contain, in addition to the solvent principally contained as described above, an ester solvent such as propylene glycol monomethyl ether acetate.

The solubility parameter value of the removing liquid is preferably smaller than the solubility parameter value of the solvent (B) in the topcoat composition. When the solubility parameter value of the removing liquid falls within the above range, more selective and effective removing of a part, which is likely to cause a defect, of the topcoat layer is enabled. Herein, with regard to the "solubility parameter", the value (unit: $(MPa)^{1/2}$) described in Polymer Handbook ($4^{th}$ edition) (Wiley, 1999) can be employed. Furthermore, the solubility parameter $\delta m$ in a case where the solvent is a mixed solvent of two types of solvents of solvent 1 and solvent 2 can be determined according to the equality: $\delta m = X_1 \times \delta_1 + (1-X_1) \times \delta_2$, wherein $\delta_1$ and $\delta_2$ represent the solubility parameter values of solvent 1 and solvent 2, respectively, and $X_1$ is the molar fraction of solvent 1 in the solvent.

The lower limit of the value calculated by subtracting the solubility parameter value of the removing liquid from the parameter value of the solvent (B) of the topcoat composition is preferably 0.1, and more preferably 0.5. The upper limit of the value is preferably 8, and more preferably 5.

The upper limit of the solubility parameter value of the removing liquid is preferably 21, more preferably 19, still more preferably 18, and particularly preferably 17. The lower limit of the solubility parameter value is preferably 11, and more preferably 12.

It is preferred that the removing liquid provides a feature that:

the topcoat layer is dissolved to remain so as to have a thickness of no less than 2 nm and no greater than 28 nm, provided that the photoresist film is formed on the front face of the substrate, the topcoat layer having a thickness of 30 nm is laminated on the front face of the photoresist film, and the removing liquid is brought into contact with the topcoat layer for 60 seconds.

The lower limit of the ratio of the average thickness of the topcoat layer which remains after the removing step to the average thickness of the topcoat layer formed in the laminating step (topcoat layer residual ratio) is preferably 30%, more preferably 50%, and still more preferably 60%. The upper limit of the topcoat layer residual ratio is preferably 90%, more preferably 85%, and still more preferably 80%.

The removing step may be performed at an arbitrary time point so long as it is performed between the liquid immersion lithography step and the development step. For example, when the PEB is performed after the liquid immersion lithography, the removing step may be performed before, concurrently with, or after the PEB. However, in light of forming a more preferable resist pattern, the removing step is preferably performed after the PEB.

Exemplary procedure for removing a part of the topcoat layer by using the removing liquid includes a procedure of spin-coating the dissolution solution on the topcoat layer, and then leaving the resultant topcoat layer to stand for a given time period, followed by spin-drying, and the like.

The lower limit of the value ($\theta_1 - \theta_2$) calculated by subtracting the receding contact angle $\theta_2$ on the front face of the topcoat layer after the removing step from the receding contact angle $\theta_1$ of the front face of the topcoat layer formed in the laminating step is preferably 10°, more preferably 15°, and still more preferably 20°. The upper limit of the value is preferably 65°, more preferably 55°, and still more preferably 35°.

Development Step

In this step, the aforementioned photoresist film is developed. This development is performed by bringing the photoresist film that had been subjected to the liquid immersion lithography into contact with the developer solution. Thus, the part of the topcoat layer which was not removed in the removing step can be removed and a desired resist pattern can be obtained. In a case where other layer has been formed between the photoresist film and the topcoat layer, the other layer is removed as well.

The developer solution is exemplified by an alkaline developer solution, an organic solvent-developer solution, and the like.

Exemplary alkaline developer solution includes an alkaline aqueous solution prepared by dissolving at least one type of alkaline compounds such as sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, a tetraalkylammonium hydroxide (for example, tetramethylammonium hydroxide (TMAH) and tetraethylammonium hydroxide), pyrrole, piperidine, choline, 1,8-diazabicyclo-[5.4.0]-7-undecene, 1,5-diazabicyclo-[4.3.0]-5-nonane, and the like. Of these, an aqueous solution of a tetraalkylammonium hydroxide is preferred, and an aqueous solution of TMAH is more preferred.

Exemplary organic solvent-developer solution is similar to those exemplified as the organic solvent which may be contained in the removing liquid described above. Of these, the ether solvent, the ketone solvent and the ester solvent are preferred, and n-butyl acetate, isopropyl acetate, amyl acetate, anisole, 2-butanone, methyl-n-butyl ketone and methyl-n-amyl ketone are more preferred. These organic solvent may be used either alone of one type, or two more types thereof may be used in combination.

The lower limit of the content of the organic solvent in the organic solvent-developer solution is preferably 80% by mass, more preferably 90% by mass, and still more preferably 99% by mass. When the content of the organic solvent in the organic solvent-developer solution falls within the above range, a dissolution contrast between the light-exposed regions and the light-unexposed regions can be improved, and consequently the resist pattern being superior in the lithography performances can be formed. A component other than the organic solvent is exemplified by water, silicone oil and the like.

The developer solution may contain a nitrogen-containing compound. When the developer solution contains the nitrogen-containing compound, a film loss in the formed resist pattern can be reduced.

Examples of the nitrogen-containing compound include (cyclo)alkylamine, a nitrogen-containing heterocyclic compound, an amide group-containing compound, a urea compound, and the like.

An appropriate amount of a surfactant may be added to the developer solution, as needed. As the surfactant, an ionic or nonionic fluorochemical surfactant and/or an ionic or nonionic silicone-based surfactant, etc., may be employed.

Examples of the development procedure include: a procedure in which the substrate is immersed for a given time period in the developer solution charged in a container (dip procedure); a procedure in which the developer solution is placed to form a dome-shaped bead by way of the surface tension on the front face of the substrate for a given time period to conduct a development (puddle procedure); a procedure in which the developer solution is sprayed onto the front face of the substrate (spray procedure); a procedure in which the developer solution is continuously applied onto the substrate that is rotated at a constant speed while scanning with a developer solution-application nozzle at a constant speed (dynamic dispensing procedure); and the like.

After the development step, a rinsing step of rinsing the photoresist film with a rinse agent is preferably is preferably included. As the rinse agent in the rinsing step, an organic solvent may be used. When the organic solvent is used as the rinse agent, scums which may be generated can be efficiently washed away.

The organic solvent for use as the rinse agent is exemplified by a hydrocarbon solvent, a ketone solvent, an ester solvent, an alcohol solvent, and an amide solvent. Of these, the alcohol solvent and the ester solvent are preferred, and the alcohol solvent is more preferred. The alcohol solvent is preferably a monohydric alcohol solvent having 6 to 8 carbon atoms.

Exemplary monohydric alcohol solvent having 6 to 8 carbon atoms includes a chain monohydric alcohol, a cyclic monohydric alcohol, and the like, and specific examples thereof include 1-hexanol, 1-heptanol, 1-octanol, 4-methyl-2-pentanol, 2-hexanol, 2-heptanol, 2-octanol, 3-hexanol, 3-heptanol, 3-octanol, 4-octanol, benzyl alcohol, and the like. Of these, 1-hexanol, 2-hexanol, 2-heptanol and 4-methyl-2-pentanol are preferred.

Each component which may be contained in the rinse agent may be used either alone, or two or more types thereof. The upper limit of the moisture content in the rinse agent is preferably 10% by mass, more preferably 5% by mass, and still more preferably 3% by mass. When the moisture content in the rinse agent is no greater than the upper limit, favorable development characteristics can be attained. It is to be noted that the rinse agent may contain a surfactant.

The procedure for rinsing with the rinse agent is exemplified by: a procedure in which the rinse agent is continuously applied onto the substrate that is rotated at a constant speed (spin-coating procedure); a procedure in which the substrate is immersed for a given time period in the rinse agent charged in a container (dip procedure), a procedure in which the rinse agent is sprayed on the front face of the substrate (spray procedure), and the like.

EXAMPLES

Hereinafter, the embodiment of the present invention will be explained in more detail by way of Examples, but the present invention is not in any way limited to these Examples. Measuring methods for various types of physical properties are shown below.

Syntheses of Polymers

Monomers used in the synthesis of the polymer for the photoresist composition, and the polymer for the topcoat composition are shown below.

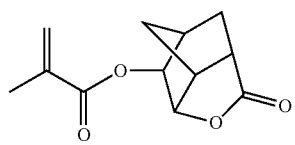

(M-1)

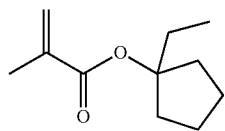

(M-2)

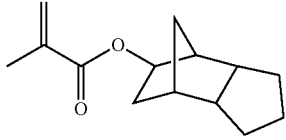

(M-3)

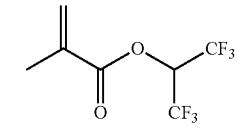

(M-4)

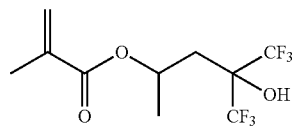

(M-5)

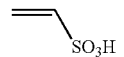

(M-6)

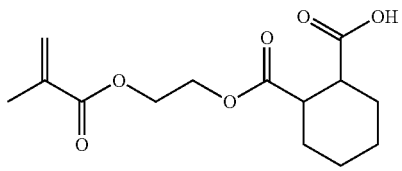

(M-7)

Syntheses of Polymers for Photoresist Compositions

Synthesis Example 1: Synthesis of Polymer 1

A monomer solution was prepared by dissolving 53.93 g of the compound (M-1) (50 mol %), 35.38 g of the compound (M-2) (40 mol %) and 10.69 g of the compound (M-3) (10 mol %) in 200 g of 2-butanone, and further charging therein 5.58 g of dimethyl 2,2'-azobis(2-methylpropionate) as a polymerization initiator. Next, a 500 mL three-neck flask to which 100 g of 2-butanone had been charged was purged with nitrogen for 30 min. After the purging with nitrogen, the reaction vessel was heated to 80° C. while the contents therein were stirred, and the prepared monomer solution was added dropwise over 3 hrs by using a dropping funnel. The time of the start of the dropwise addition was regarded as the time of the start of the polymerization reaction, and the polymerization reaction was allowed to proceed for 6 hrs. After the completion of the polymerization reaction, the polymerization reaction mixture was water-cooled to 30° C. or below. Then, the cooled polymerization reaction mixture was charged into 2,000 g of methanol, and the precipitated white powder was filtered off. The collected white powder was washed twice with 400 g of methanol in a slurry, filtered off, and dried at 50° C. for 17 hrs, whereby the polymer 1 as a white powder was obtained (amount: 74 g; yield: 74%). The polymer 1 had the Mw of 6,900 and the Mw/Mn of 1.70. The result of the $^{13}$C-NMR analysis indicated that the proportions of the structural units derived from (M-1), (M-2), and (M-3) were 53.0 mol %, 37.2 mol % and 9.8 mol %, respectively. In addition, the content of the low molecular weight component derived from each monomer in the polymer 1 was 0.03% by mass.

Synthesis Example 2: Synthesis of Polymer 2

A monomer solution was prepared by dissolving 85 mol % of the compound (M-2) and 15 mol % of the compound (M-4) in 200 g of 2-butanone, and further dissolving therein azobisisobutyronitrile as a polymerization initiator in an amount of 7 mol % with respect to the total compounds. The total mass of the monomers used was 100 g. Next, a 500 mL three-neck flask into which 100 g of 2-butanone had been charged was heated to 80° C. while the contents therein were stirred under a nitrogen atmosphere, and then the prepared monomer solution was added dropwise over 3 hrs. After the completion of the dropwise addition, heating was performed for another 3 hrs at 80° C. to allow the polymerization reaction. After the completion of the polymerization reaction, the reaction solution was cooled to room temperature. After the transfer of the reaction solution to a separatory funnel, the reaction solution was homogeneously diluted with 300 g of n-hexane, and 1,200 g of methanol was charged thereinto and mix therewith. Subsequently, 60 g of distilled water was charged, followed by further stirring, and the mixture was left to stand for 30 min. Next, the lower layer was collected, and the solvent was replaced with propylene glycol monomethyl ether acetate, whereby a propylene glycol monomethyl ether acetate solution of the polymer 2 was obtained (yield: 79%). The polymer 2 had the Mw of 5,200 and the Mw/Mn of 1.82. In addition, the result of the $^{13}$C-NMR analysis indicated that the proportions of the structural units derived from (M-2) and (M-4) were 85.0 mol % and 15.0 mol %, respectively.

TABLE 1

| Polymer | | Monomer | | Yield (%) | Mw | Mw/Mn |
| --- | --- | --- | --- | --- | --- | --- |
| | type | amount (mol %) | proportion of structural unit (mol %) | | | |
| Synthesis Example 1 | Polymer 1 | M-1 | 50 | 53.0 | 74 | 6,900 | 1.70 |
| | | M-2 | 40 | 37.2 | | | |
| | | M-3 | 10 | 9.8 | | | |
| Synthesis Example 2 | Polymer 2 | M-2 | 85 | 85.0 | 79 | 5,200 | 1.82 |
| | | M-4 | 15 | 15.0 | | | |

Syntheses of Polymer for Topcoat Composition

Synthesis Example 3: Synthesis of Polymer 3

A polymerization initiator solution was prepared by dissolving 25.0 g of 2, 2-azobis(methyl 2-methylisopropionate) as a polymerization initiator in 25.0 g of 2-butanone. Meanwhile, 133.6 g of the aforementioned compound (M-4) (50 mol %), 166.4 g of the compound (M-5) (50 mol %), and 575.0 g of 2-butanone were charged into a 2,000 mL three-neck flask equipped with a thermometer and a dropping funnel, and the flask was purged with nitrogen for 30 min. After purging with nitrogen, the contents in the flask were heated to 80° C. while the mixture was stirred with a magnetic stirrer. Next, the prepared polymerization initiator solution was added dropwise over 5 min using a dropping funnel and aged for 6 hrs, followed by cooling to 30° C. or below to obtain a polymerization reaction mixture.

Next, the resulting polymerization reaction mixture was concentrated to 600 g and then transferred to a separatory funnel. Into the separatory funnel were charged 193 g of methanol and 1,542 g of n-hexane to perform purification through separation. After the separation, the lower layer liquid was collected. Into the collected lower layer were charged 117 g of 2-butanone and 1,870 g of n-hexane liquid to perform purification through separation. After the separation, the lower layer liquid was collected. Into the further collected lower layer liquid were charged 93 g of methanol, 77 g of 2-butanone, and 1,238 g of n-hexane to perform purification through separation. After the separation, the lower layer liquid was collected. The collected lower layer liquid was subjected to replacement with 4-methyl-2-pentanol, and the resulting solution was washed with distilled water. Again, the collected lower layer liquid was subjected to replacement with 4-methyl-2-pentanol to obtain a liquid containing the polymer 3 (yield: 79%). The polymer 3 had the Mw of 7,700 and the Mw/Mn of 1.61. In addition, the result of the $^{13}$C-NMR analysis indicated that the proportions of the structural units derived from (M-4) and (M-5) were 49 mol % and 51 mol %, respectively.

Synthesis Examples 4 and 5: Syntheses of Polymers 4 and 5

The polymers 4 and 5 were each synthesized in a similar manner to Synthesis Example 3 except that the type and the amount of the monomer used were as shown in Table 2 below. The yield (%) of the synthesized polymers 4 and 5, the Mw and the Mw/Mn, and the proportions (mol %) of the structural units derived from each monomer are shown together in Table 2.

Synthesis Example 6: Synthesis of Polymer 6

A monomer solution was prepared by dissolving 46.95 g of the compound (M-5) (85 mol %) and 6.91 g of 2,2'-azobis (methyl 2-methylpropionate) as a polymerization initiator in 100 g of isopropanol. Meanwhile, 50 g of isopropanol was charged into a 500 mL three-neck flask equipped with a thermometer and a dropping funnel, and the flask was purged with nitrogen for 30 min. After purging with nitrogen, the contents in the flask were heated to 80° C. while the mixture was stirred with a magnetic stirrer. Next, the prepared monomer solution was added dropwise over 2 hrs using a dropping funnel. After the completion of the dropwise addition, the reaction was permitted further for one hour. Thereafter, 10 g of an isopropanol solution of 3.05 g (15 mol %) of the compound (M-6) was added dropwise for 30 min to allow the reaction further for one hour, followed by cooling to 30° C. or below to obtain a polymerization reaction mixture.

Next, the resulting polymerization reaction mixture was concentrated to 150 g and then transferred to a separatory funnel. Into the separatory funnel were charged 50 g of methanol and 600 g of n-hexane 1 to perform purification through separation. After the separation, the lower layer liquid was collected. The lower layer liquid was diluted with isopropanol to adjust the amount to be 100 g, and transferred to the separatory funnel again. Thereafter, 50 g of methanol and 600 g of n-hexane were charged into the separatory funnel to perform purification through separation. After the separation, the lower layer liquid was collected. The collected lower layer liquid was subjected to replacement with 4-methyl-2-pentanol and the total amount was adjusted to be 250 g, and then 250 g of water was added to perform purification through separation. After the separation, the upper layer liquid was collected. Next, the resulting upper layer liquid was subjected to replacement with 4-methyl-2-pentanol again to obtain a liquid containing the polymer 6 (yield: 79%). The polymer 6 had the Mw of 7,950 and the Mw/Mn of 1.50. In addition, the result of the $^{13}$C-NMR analysis indicated that the proportions of the structural units derived from (M-5) and (M-6) were 95 mol % and 5 mol %, respectively.

Synthesis Example 7: Synthesis of Polymer 7

The polymer 7 was synthesized in a similar manner to Synthesis Example 6 except that the type and the amount of the monomer used were as shown in Table 2 below. The yield (%) of the synthesized polymer 7, the Mw and the Mw/Mn, and the proportions (mol %) of the structural units derived from each monomer are shown together in Table 2.

TABLE 2

|  | Polymer | Monomer type | amount (mol %) | proportion of structural unit (mol %) | Yield (%) | Mw | Mw/Mn |
|---|---|---|---|---|---|---|---|
| Synthesis Example 3 | Polymer 3 | M-4 | 50 | 49 | 79 | 7,700 | 1.61 |
|  |  | M-5 | 50 | 51 |  |  |  |
| Synthesis Example 4 | Polymer 4 | M-4 | 60 | 59 | 78 | 7,800 | 1.62 |
|  |  | M-5 | 40 | 41 |  |  |  |
| Synthesis Example 5 | Polymer 5 | M-4 | 70 | 69 | 72 | 7,500 | 1.65 |
|  |  | M-5 | 30 | 31 |  |  |  |
| Synthesis Example 6 | Polymer 6 | M-5 | 85 | 95 | 79 | 7,950 | 1.50 |
|  |  | M-6 | 15 | 5 |  |  |  |
| Synthesis Example 7 | Polymer 7 | M-6 | 15 | 5 | 80 | 8,010 | 1.50 |
|  |  | M-7 | 85 | 95 |  |  |  |

Preparation of Compositions

Preparation of Photoresist Compositions

Preparation Example 1: Preparation of Photoresist Composition 1

A photoresist composition 1 was prepared by: mixing 100 parts by mass of the polymer 1, 1.5 parts by mass of triphenylsulfonium nonafluoro-n-butanesulfonate as a radiation-sensitive acid generating agent, 6 parts by mass of 1-(4-n-butoxynaphthalen-1-yl)tetrahydrothiophenium nonafluoro-n-butanesulfonate, and 0.65 parts by mass of R-(+)-(tert-butoxycarbonyl)-2-piperidinemethanol as an acid diffusion control agent; adding to this mixture as a solvent 2,900 parts by mass of propylene glycol monomethyl ether acetate, 1,250 parts by mass of cyclohexanone and 100 parts by mass of γ-butyrolactone to adjust the solid content concentration to 5% by mass; and filtering the resulting mixture through a filter having a pore size of 30 nm.

Preparation Example 2: Preparation of Photoresist Composition 2

A photoresist composition 2 was prepared by: mixing 97 parts by mass of the polymer 1, 3 parts by mass of the polymer 2, 1.5 parts by mass of triphenylsulfonium nonafluoro-n-butanesulfonate as a radiation-sensitive acid generating agent, 6 parts by mass of 1-(4-n-butoxynaphthalen-1-yl)tetrahydrothiopheniumnonafluoro-n-butanesulfonate, and 0.65 parts by mass of R-(+)-(tert-butoxycarbonyl)-2-piperidinemethanol as an acid diffusion control agent; adding to this mixture as a solvent 2,900 parts by mass of propylene glycol monomethyl ether acetate, 1,250 parts by mass of cyclohexanone and 100 parts by mass of γ-butyrolactone to adjust the solid content concentration to 5% by mass; and filtering the resulting mixture through a filter having a pore size of 30 nm.

Preparation of Topcoat Compositions

Preparation Example 3

A topcoat composition 1 was prepared by: mixing 30 parts by mass of the polymer 3 and 70 parts by mass of the polymer 6; adding to this mixture as a solvent 1,000 parts by mass of 4-methyl-2-pentanol and 4,000 parts by mass of diisoamyl ether; and filtering the resulting mixture through a filter having a pore size of 30 nm.

Preparation Examples 4 to 6

Topcoat compositions 2 to 4 were prepared in a similar manner to Preparation Example 3 except that the type and the amount of the monomer used were as shown in Table 3 below. It is to be noted that "Demnum S-20" (available from Daikin Industries, Ltd.) used for preparing the topcoat composition 4 was a chain perfluoroalkyl polyether represented by the following formula (p-1) and "Cytop" (available from Asahi Glass Co., Ltd.) was a cyclic perfluoroalkyl polyether represented by the following formula (p-2).

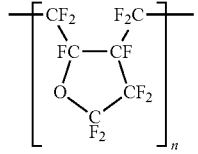

TABLE 3

|  |  | Polymer |  | Solvent |  |
|---|---|---|---|---|---|
|  | Topcoat Composition | type | content (part by mass) | type | content (part by mass) |
| Preparation Example 3 | Topcoat Composition 1 | Polymer 3/Polymer 6 | 30/70 | 4-methyl-2-pentanol/ diisoamyl ether | 1,000/4,000 |
| Preparation Example 4 | Topcoat Composition 2 | Polymer 4/Polymer 6 | 30/70 | 4-methyl-2-pentanol/ diisoamyl ether | 1,000/4,000 |
| Preparation Example 5 | Topcoat Composition 3 | Polymer 5/Polymer 7 | 20/80 | 4-methyl-2-pentanol/ diisoamyl ether | 2,500/2,500 |
| Preparation Example 6 | Topcoat Composition 4 | Demnum S-20/Cytop | 13/87 | perfluorotributylamine | 4,000 |

Formation of Resist Pattern

Examples 1 to 13 and Comparative Examples 1 to 4

An underlayer antireflective film having an average thickness of 105 nm was fortified on the front face of a 12-inch silicon wafer by spin-coating a composition for underlayer antireflective film ("ARC66" available from Nissan Chemical Industries, Ltd.) using a coater/developer ("Lithius Pro-i" available from Tokyo Electron Limited), followed by PB. Next, the photoresist composition shown in Table 4 below was spin-coated using the coater/developer, followed by PB at 90° C. for 60 sec and then cooling at 23° C. for 30 sec to form a photoresist film having an average thickness of 90 nm. Thereafter, the topcoat composition shown in Table 4 below was applied on the front face of the photoresist film, followed by PB at 90° C. for 60 sec, whereby a topcoat layer having an average thickness of 30 nm was formed.

Next, an exposure was performed using an ArF Immersion Scanner ("S610C" available from Nikon Corporation) through a mask for formation of a pattern of 45 nm line/90 nm pitch under optical conditions of NA of 1.30 and Dipole. Thereafter, rinsing was performed with ultra pure water for 60 sec by the PIR module of the Lithius Pro-i, followed by leaving to stand for 60 sec in a state of water droplets remaining. Then, PEB was performed on a hot plate at 90° C. for 60 sec, followed by cooling at 23° C. for 30 sec.

Next, by spin-coating with the removing liquid (the ratio being a mass ratio, in a case where the removing liquid was a mixed solvent) shown in Table 4 below, a part of the topcoat layer was removed. Then, a puddle development was performed for 10 sec by using a 2.38% by mass aqueous TMAH solution as a developer solution. Thereafter, spin-drying was performed at 2,000 rpm for 15 sec, whereby a substrate having a resist pattern formed thereon was obtained. It is to be noted that "-" in Comparative Example 1 indicates that the removing by the removing liquid was not performed.

Evaluations

With respect to the formation of the resist pattern, the receding contact angles (°) of the front face of the topcoat layer before and after removing a part thereof, the topcoat layer residual ratio (%), and watermark defects and residue defects were evaluated according to the following procedures. The results of the evaluations are shown together in Table 4.

Receding Contact Angle of Front Face of Topcoat Layer before and after Removing a Part Receding contact angles of water on the front face of the topcoat layer before and after removing a part of the topcoat layer were each measured. The topcoat composition was spin-coated on an 8-inch silicon wafer, followed by PB on a hot plate at 90° C. for 60 sec, whereby a substrate having the topcoat layer having a film thickness of 30 nm formed thereon (before removing a part) was obtained. Next, the removing liquid shown in Table 4 below was spin-coated on the topcoat layer of this substrate, which was then left to stand for 60 sec. Thereafter, spin-drying was performed at 2,000 rpm for 15 sec, whereby a substrate having the topcoat layer formed thereon after removing a part was obtained.

Receding contact angles of each of the obtained substrates having the topcoat layer formed thereon before and after removing a part, were measured quickly with a contact angle meter ("DSA-10" available from KRUSS GmbH) in an environment of room temperature of 23° C., a humidity of 45%, and an ordinary pressure, according to the following procedure.

First, the position of a wafer stage of the contact angle meter was adjusted, and the wafer was placed on the adjusted stage. Next, water was injected into a needle, and the position of the needle was fine-tuned to an initial position which allowed a water bead to be formed on the wafer placed as described above. Thereafter, water was discharged from the needle to form a 25 μL water bead on the wafer, then the needle was once retracted from the water bead, and the needle was lowered again to the initial position so as to position a tip of the needle in the water bead. Then, the water bead was suctioned for 90 sec with the needle at a rate of 10 μL/min, during which a contact angle was concurrently measured once per second, 90 times in total. Of the measurement values, contact angle measurements acquired for 20 sec after the time point when the measurement of the contact angle became stable were averaged to obtain a reading of the receding contact angle (unit: degree (°)).

Topcoat Layer Residual Ratio

The average thickness of the topcoat layer after removing a part was measured, and the topcoat layer residual ratio was determined. A photoresist film having an average thickness of 90 nm was formed on an 8-inch silicon wafer through coating with a photoresist composition by using a spin coater ("CLEAN TRACK ACT-8" available from Tokyo Electron Limited), followed by heating at 90° C. for 60 sec. Then, a topcoat composition was applied using the spin coater, followed by heating at 90° C. for 60 sec to form a topcoat layer having an average thickness of 30 nm. Next, after removing the topcoat layer formed on the front face of the photoresist film with the removing liquid shown in Table 4 below, the average thickness of the remaining topcoat layer was measured, and the topcoat layer residual ratio (%) with respect to the average thickness of 30 nm originally measured was calculated based on this measured value.

Watermark Defects-Inhibiting Property and Residue Defects-Inhibiting Property

The substrates having the resist pattern formed thereon obtained as above were inspected for defects by using a defect inspection apparatus ("KLA2810" available from KLA-Tencor Corporation), and observed by using a scanning electron microscope ("RS6000" available from Hitachi High-Technologies Corporation), whereby the number of watermark defects and residue defects was measured. The watermark defects-inhibiting property was evaluated to be: A "favorable" in the case of the number of defects per wafer being 0; and B "unfavorable" in the case of the number of defects per wafer being no less than 1. The symbol "-" in Comparative Example 1 indicates the failure of the measurement due to too many residue defects being present. The residue defects-inhibiting property was evaluated to be: A "favorable" in the case of the number of defects per wafer being no greater than 100; and B "unfavorable" in the case of the number of defects per wafer being more than 100.

TABLE 4

| | Photoresist composition | Topcoat composition | Removing Liquid | Receding contact angle before removing a part (°) | Topcoat layer residual ratio (%) | Receding contact angle after removing a part (°) | Watermark defects-inhibiting property | Residue defects-inhibiting property |
|---|---|---|---|---|---|---|---|---|
| Example 1 | Photoresist composition 1 | Topcoat composition 1 | diisoamyl ether | 80 | 69 | 70 | A | A |
| Example 2 | Photoresist composition 1 | Topcoat composition 2 | dibutyl ether | 84 | 69 | 70 | A | A |
| Example 3 | Photoresist composition 1 | Topcoat composition 3 | diisoamyl ether | 88 | 78 | 25 | A | A |
| Example 4 | Photoresist composition 1 | Topcoat composition 2 | decane | 84 | 69 | 71 | A | A |
| Example 5 | Photoresist composition 1 | Topcoat composition 3 | cyclohexane | 88 | 78 | 42 | A | A |
| Example 6 | Photoresist composition 1 | Topcoat composition 2 | 1-decanol | 84 | 69 | 70 | A | A |
| Example 7 | Photoresist composition 1 | Topcoat composition 3 | perfluoro(2-butyltetrahydrofuran)/dibutyl ether = 5/95 | 88 | 78 | 25 | A | A |
| Example 8 | Photoresist composition 1 | Topcoat composition 2 | 4-methyl-2-pentanol/diisoamyl ether = 5/95 | 84 | 69 | 70 | A | A |
| Example 9 | Photoresist composition 1 | Topcoat composition 3 | 4-methyl-2-pentanol/cyclohexane = 10/90 | 88 | 78 | 39 | A | A |
| Example 10 | Photoresist composition 2 | Topcoat composition 1 | diisoamyl ether | 80 | 69 | 70 | A | A |
| Example 11 | Photoresist composition 2 | Topcoat composition 2 | 4-methyl-2-pentanol/diisoamyl ether = 5/95 | 84 | 69 | 69 | A | A |
| Example 12 | Photoresist composition 2 | Topcoat composition 3 | dibutyl ether | 88 | 78 | 25 | A | A |
| Example 13 | Photoresist composition 2 | Topcoat composition 3 | propylene glycol monomethyl ether acetate/diisoamyl ether = 20/80 | 88 | 78 | 25 | A | A |
| Comparative Example 1 | Photoresist composition 1 | Topcoat composition 2 | — | 84 | 100 | 84 | — | B |
| Comparative Example 2 | Photoresist composition 1 | Topcoat composition 2 | 4-methyl-2-pentanol | 84 | 0 | 65 | A | B |
| Comparative Example 3 | Photoresist composition 1 | Topcoat composition 4 | perfluoro(2-butyltetrahydrofuran) | 105 | 0 | 65 | A | B |
| Comparative Example 4 | Photoresist composition 2 | — | propylene glycol monomethyl ether acetate/diisoamyl ether = 20/80 | 84 | 0 | 65 | A | B |

From the results shown in Table 4, it was found that the resist pattern-forming method according to Examples enabled the generation of both watermark defects and residue defects to be inhibited. To the contrary, it was found that the resist pattern-forming method according to Comparative Examples failed to inhibit the generation of residue defects.

According to the resist pattern-forming method of the embodiment of the present invention, a resist pattern with less watermark defects and residue defects can be formed. Therefore, the resist pattern-forming method can be preferably used for the processing processes of semiconductor devices for which the further progress of miniaturization in the future is expected.

Obviously, numerous modifications and variations of the present invention are possible in light of the above teachings. It is therefore to be understood that within the scope of the appended claims, the invention may be practiced otherwise than as specifically described herein.

What is claimed is:

1. A resist pattern-forming method comprising:
    applying a photoresist composition directly or indirectly on a front face of a substrate to form a photoresist film;
    laminating a topcoat layer directly or indirectly on a front face of the photoresist film;
    subjecting the photoresist film to liquid immersion lithography in a presence of a liquid immersion liquid on a front face of the topcoat layer;
    removing part of the topcoat layer by a removing liquid comprising an organic solvent as a principal component after subjecting the photoresist film to the liquid immersion lithography such that other part of the topcoat layer is remained; and
    starting to develop the photoresist film in a state where the other part of the topcoat layer is remained.

2. The resist-pattern-forming method according to claim 1, wherein the removing liquid provides a feature that:
    the topcoat layer is dissolved to remain so as to have a thickness of no less than 2 nm and no greater than 28 nm, provided that the photoresist film is formed on the front face of the substrate, the topcoat layer having a thickness of 30 nm is laminated on the front face of the photoresist film, and the removing liquid is brought into contact with the topcoat layer for 60 seconds.

3. The resist-pattern-forming method according to claim 1, wherein
    the topcoat layer comprises two or more kinds of polymers having different characteristics from one another, and
    in removal of the part of the topcoat layer, a polymer among the two or more kinds of polymers that is localized on a front face side of the topcoat is at least partially removed.

4. The resist-pattern-forming method according to claim 3, wherein
    the two or more kinds of polymers comprise a water-repellent resin and an acidic resin, and
    in the removal of the part of the topcoat layer, at least part of the water-repellent resin is removed.

5. The resist-pattern-forming method according to claim 4, wherein the water-repellent resin is a fluorine-containing resin.

6. The resist-pattern-forming method according to claim 5, wherein a mass percentage content of fluorine atom in the fluorine-containing resin is 0.1 to 30% by mass.

7. The resist-pattern-forming method according to claim 5, wherein a mass percentage content of fluorine atom in the fluorine-containing resin is 5 to 25% by mass.

8. The resist-pattern-forming method according to claim 4, wherein the acidic resin is at least one selected from the group consisting of a resin having an oxoacid group and a resin having a phenolic hydroxyl group.

9. The resist-pattern-forming method according to claim 1, wherein the topcoat layer is laminated by applying a composition for forming the topcoat layer which comprises a solvent directly or indirectly on the front face of the photoresist film.

10. The resist-pattern-forming method according to claim 9, wherein a solubility parameter value of the removing liquid is smaller than a solubility parameter value of the solvent in the composition for forming the topcoat layer.

11. The resist-pattern-forming method according to claim 1, wherein the organic solvent comprises an ether solvent as a principal component.

12. A resist pattern-forming method comprising:
    applying a photoresist composition directly or indirectly on a front face of a substrate to form a photoresist film;
    laminating a topcoat layer directly or indirectly on a front face of the photoresist film;
    subjecting the photoresist film to liquid immersion lithography in a presence of a liquid immersion liquid on a front face of the topcoat layer;
    removing part of the topcoat layer after subjecting the photoresist film to the liquid immersion lithography such that other part of the topcoat layer is remained; and
    starting to develop the photoresist film in a state where the other part of the topcoat layer is remained,
    wherein
    the topcoat layer comprises two or more kinds of polymers having different characteristics from one another and comprising a water-repellent resin and an acidic resin, and
    in removal of the part of the topcoat layer, a polymer among the two or more kinds of polymers that is the water-repellent resin and is localized on a front face side of the topcoat, is at least partially removed.

13. The resist-pattern-forming method according to claim 12, wherein the part of the topcoat layer is removed by a removing liquid.

14. The resist-pattern-forming method according to claim 13, wherein the removing liquid provides a feature that:
    the topcoat layer is dissolved to remain so as to have a thickness of no less than 2 nm and no greater than 28 nm, provided that the photoresist film is formed on the front face of the substrate, the topcoat layer having a thickness of 30 nm is laminated on the front face of the photoresist film, and the removing liquid is brought into contact with the topcoat layer for 60 seconds.

15. The resist-pattern-forming method according to claim 13, wherein the removing liquid comprises an organic solvent as a principal component.

16. The resist-pattern-forming method according to claim 15, wherein the organic solvent comprises an ether solvent as a principal component.

17. The resist-pattern-forming method according to claim 12, wherein the topcoat layer is laminated by applying a composition for forming the topcoat layer which comprises a solvent directly or indirectly on the front face of the photoresist film.

18. The resist-pattern-forming method according to claim 17, wherein a solubility parameter value of the removing liquid is smaller than a solubility parameter value of the solvent in the composition for forming the topcoat layer.

19. The resist-pattern-forming method according to claim 12, wherein the water-repellent resin is a fluorine-containing resin.

20. The resist-pattern-forming method according to claim 19, wherein a mass percentage content of fluorine atom in the fluorine-containing resin is 0.1 to 30% by mass.

21. The resist-pattern-forming method according to claim 19, wherein a mass percentage content of fluorine atom in the fluorine-containing resin is 5 to 25% by mass.

22. The resist-pattern-forming method according to claim 12, wherein the acidic resin is at least one selected from the group consisting of a resin having an oxoacid group and a resin having a phenolic hydroxyl group.

* * * * *